(12) United States Patent
Ueda et al.

(10) Patent No.: US 7,529,113 B2
(45) Date of Patent: May 5, 2009

(54) MAGNETIC STORAGE DEVICE

(75) Inventors: Yoshihiro Ueda, Yokohama (JP); Tsuneo Inaba, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 183 days.

(21) Appl. No.: 11/736,300

(22) Filed: Apr. 17, 2007

(65) Prior Publication Data

US 2007/0268733 A1 Nov. 22, 2007

(30) Foreign Application Priority Data

May 17, 2006 (JP) ............... 2006-137983

(51) Int. Cl.
*G11C 5/06* (2006.01)
(52) U.S. Cl. .................. 365/63; 365/158; 365/171; 365/173
(58) Field of Classification Search .............. 365/63, 365/158, 171, 173
See application file for complete search history.

(56) References Cited

U.S. PATENT DOCUMENTS 6,906,939 B2 * 6/2005 Rinerson et al. ............... 365/63

FOREIGN PATENT DOCUMENTS

JP 2005236177 9/2005

OTHER PUBLICATIONS

Dietmar Gogl, et al., "A 16Mb MRAM Featuring Bootstrapped Write Drivers", IEEE Journal of Solid-State Circuits, vol. 40, No. 4, Apr. 2005, p. 902.

* cited by examiner

*Primary Examiner*—David Lam
(74) *Attorney, Agent, or Firm*—Oblon, Spivak, McClelland, Maier & Neustadt, P.C.

(57) ABSTRACT

A magnetic storage device includes magnetoresistance effect elements. First and second write lines extend along a first direction. Current flows in the first and second write lines only in the first direction and a second direction opposite to the first direction, respectively. A third write line extends along a third direction orthogonal to the first direction. The elements are respectively placed where the first and third write lines cross and the second and third write lines cross. First and second electrodes are provided between the first and third write lines and between the second and third write lines. First and second plugs are respectively connected to the first and second electrodes. The first plug stands at a position apart from the first write line along the third direction. The second plug stands at a position apart from the second write line along the opposite direction to the third direction.

19 Claims, 11 Drawing Sheets

MAGNETIC STORAGE DEVICE

CROSS-REFERENCE TO RELATED APPLICATIONS

This application is based upon and claims the benefit of priority from prior Japanese Patent Application No. 2006-137983, filed May 17, 2006, the entire contents of which are incorporated herein by reference.

BACKGROUND OF THE INVENTION

1. Field of the Invention

The present invention relates to a magnetic storage device. For example, the present invention relates to a form and placement of parts in a memory cell.

2. Description of the Related Art

The most-widely used type of a memory cell of a magnetic random access memory (MRAM) is 1T1R type which includes one magnetoresistance effect element and one select transistor. Write current circuits are connected to both ends of two types of write lines for generating a magnetic field which is applied to each magnetoresistance effect element. An electric current flows from the write current circuit at one end toward the write current circuit at the other end. Providing the write current circuits between adjacent memory cell arrays allows the write current and control signals to be shared by more than one memory cell arrays, which can realize simpler circuitry.

In the 1T1R type memory cell, the magnetoresistance effect element is electrically connected to the select transistor through a bottom electrode and a plug. Since the magnetoresistance effect element needs to lie between the two type write lines, the plug is placed away from a cross point of the write lines. The bottom electrode has a flat shape which is different from that of the magnetoresistance effect element in order to be connected to the plug. In addition, the bottom electrode may have a flat shape, such as an L-shaped form, in order to facilitate integration of the memory cell.

All the memory cells desirably operate in the same manner in order to secure margins of operation. In order to achieve such request, each part, such as an electrode, the magnetoresistance effect element, and interconnect, is made to have a same physical form to unify the characteristics of each memory cell (refer to Dietmar Gogl et al., "A 16-Mb MRAM Featuring Bootstrapped Write Drivers", IEEE journal of Solid-state Circuits, April 2005, vol. 40 pp. 902).

The IEEE journal reference does not refer to a write magnetic field. However, in order to make the characteristics of each memory cell homogeneous, even a direction, size and so forth of the write magnetic field are desired to be the same between each memory cell. In order to achieve this, a relative positional relationship of the electrode, the magnetoresistance effect element (especially a free layer), the interconnect, etc., is required to be the same in each memory cell.

However, if the write current circuit which can only supply a write electric current is provided between adjacent two memory cell arrays, a direction of the magnetic field applied to the memory cell is different between the memory cell of one of the memory cell array and the memory cell in the other memory cell array. Therefore, the magnetic field is applied differently to memory cells.

In addition, a bottom electrode form is known to influence the write magnetic field. One of the reasons for this is that the write magnetic field and the bottom electrode are coupled electromagnetically to influence the write magnetic field, and the coupling depends on the form of the bottom electrode. In particular, if the flat form of the bottom electrode is asymmetrical, the magnetic field is applied to the memory cells largely differently.

Further, due to reasons such as convenience in manufacturing processes, a fixed layer may have a form same as the bottom electrode. Magnetization of the fixed layer forms a leakage magnetic field in a direction corresponding to the direction thereof, and changes the write magnetic field. Then, the leakage magnetic field is influenced by a form of the fixed layer, that is, the form of the bottom electrode. Due to such reasons form of the bottom electrode creates non-uniformity in the way of applying the magnetic field to the memory cells.

As described above, depending on a combination of differences of the physical form and the relative positional relationship of each part such as the electrode, the magnetoresistance effect element, and the interconnect, the characteristics of the magnetic field applied to the memory cell are different. As a result thereof, the margins of operation are narrow.

FIG. 8 of Jpn. Pat. KOKAI Appln. Publication No. 2005-236177 discloses that two MRAM macros RMCA and RMCB are arranged in symmetry about an imaginary axis parallel to the magnetization hard axis of a magnetoresistance effect element VR. In addition, FIG. 27 discloses that two MRAM macros RMCJ and RMCK are arranged in symmetry about an imaginary axis parallel to the magnetization easy axis of the magnetoresistance effect element VR. According to the disclosure, the arrangements can attain consistency between write data and read data. Note that in the publication the directions of the write magnetic fields are all the same regardless of a configuration of the MRAM macro for writing the same logic ("0" or "1") data.

BRIEF SUMMARY OF THE INVENTION

According to an aspect of the present invention, there is provided a magnetic storage device comprising: a memory cell array having magnetoresistance effect elements placed in a matrix; a first write line extending along a first direction, current being supplied to flow in the first write line only in the first direction; a second write line extending along the first direction, current being supplied to flow in the second write line only in the second direction opposite to the first direction; a third write line extending along a third direction which is orthogonal to the first direction, the magnetoresistance effect elements being placed where the first and third write lines cross and where the second and third write lines cross; a first electrode provided between the first and third write lines; a first plug connected to the first electrode and provided at a location apart from the first write line along the third direction; a second electrode provided between the second and the third write lines; and a second plug connected to the second electrode and provided at a location apart from the second write line along an opposite direction to the third direction.

According to an aspect of the present invention, there is provided a magnetic storage device comprising: a first memory cell array and a second memory cell array having magnetoresistance effect elements placed in a matrix; a first write line extending along a first direction in the first memory cell array, current being supplied to flow in the first write line only in the first direction; a second write line extending along the first direction in the second memory cell, current being supplied to flow in the second write line only in the second direction opposite to the first direction; a third write line extending along a third direction which is orthogonal to the first direction in the first memory cell array, at least one of the magnetoresistance effect elements being placed where the first and third write lines cross; a fourth write line extending along the third direction in the second memory cell array, at least one of the magnetoresistance effect elements being placed where the second and fourth write lines cross; a first electrode provided between the first and third write lines; a first plug connected to the first electrode and provided at a location apart from the first write line along the third direction; a second electrode provided between the second and fourth write lines; and a second plug connected to the second electrode and provided at a location apart from the second write line along an opposite direction to the third direction.

According to an aspect of the present invention, there is provided a magnetic storage device comprising: a memory cell array having magnetoresistance effect elements placed in a matrix; a first write line extending along a first direction, current being supplied to flow in the first write line only in the first direction; a second write line extending along the first direction, current being supplied to flow in the second write line only in the second direction opposite to the first direction; a third write line extending along a third direction which is orthogonal to the first direction, the magnetoresistance effect elements being placed where the first and third write lines cross and where the second and third write lines cross; a first electrode provided between the first and third write lines; a first plug connected to the first electrode and provided at a location apart from the first write line along the third direction; a second electrode provided between the second and third write lines; and a second plug connected to the second electrode and provided at a location apart from the second write line along an opposite direction to the third direction, the first and second plugs being placed side by side along the first direction between the first and second write lines.

DETAILED DESCRIPTION OF THE INVENTION

Hereinafter, embodiments of the present invention will be described with reference to the accompanying drawings. In the following description, constitutional elements having similar functions and configurations are indicated by the same reference numerals, and repetitious description will be given only when such description is necessary.

Terms of up, down, left, and right used in the present specification is used in accordance with an orientation of a corresponding drawing for convenience of explanation. Similarly, terms of up, down, left, and right used in claims is also used to describe the invention for easy understanding. For this reason, the terms do not indicate an absolute position. Properly-rotated configuration which matches a relationship of the present specification, drawings, and claims is also included in the scope of the present invention.

First Embodiment

Figure 1:
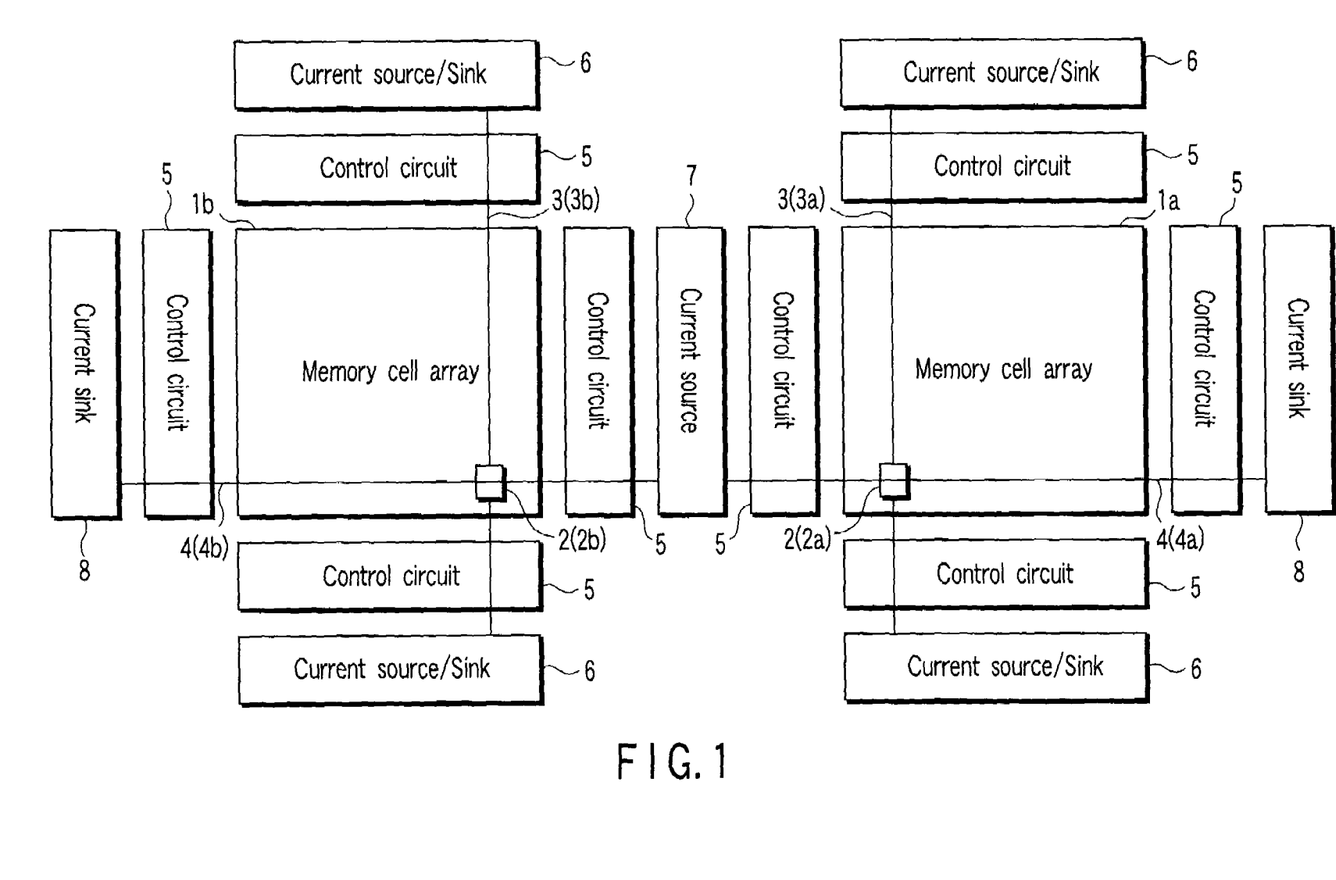
FIG. 1 is a block diagram of a magnetic storage device according to a first embodiment.

A first embodiment will be described with reference to FIGS. 1 to 9. FIG. 1 is a block diagram of a magnetic storage device according to the first embodiment. As shown in FIG. 1, the magnetic storage device includes two memory cell arrays 1a and 1b. The memory cell arrays 1a and 1b include memory cells 2a and 2b, respectively, which are placed in matrixes as described later (only one for each of the memory cells is shown FIG. 1). The memory cells 2a and 2b (correctively referred to as "memory cells 2" occasionally) include a magnetoresistance effect element as described later.

In addition, the magnetic storage device includes a write lines 3 and 4 (only one for each of the memory cell arrays is illustrated in FIG. 1) with respect to the memory cell arrays 1a and 1b. The write lines 3 and 4 extend to the direction to which the write lines cross. For example, the write line 3 extends along the up-and-down direction in the drawing, and the write line 4 extends along the left-and-right direction in the drawing. The write line 3 and the write line 4 cross at the position of the memory cell 2, and sandwich the memory cell 2.

A control circuit 5 is provided around the memory cell arrays 1a and 1b along each side of the memory cell arrays 1a and 1b.

Current sources/sinks 6 are provided side by side with two control circuits 5 along upper and lower sides of each of the memory cell arrays 1a and 1b. The current sources/sinks 6 are connected to the write lines 3 through the control circuits 5. Each of the current sources/sinks 6 is electrically connected to at least one of the write lines 3 by the control circuit 5 which include switch circuits, such as a transistor.

Corresponding to a control signal (not shown), one of a pair of the current sources/sinks 6 connected to both ends of one of the write lines 3 supplies write electric current to the write line 3, and the other one of the pair draws the electric current from the write line 3. Therefore, the write lines 3 (write lines 3a) passing through the memory cell array 1a and the write lines 3 (write lines 3b) passing through the memory cell array 1b may have both the electric current flowing upwardly and the electric current flowing downwardly in FIG. 1. Depending on the direction of the electric current flowing through the write lines 3, desired data is written into the target memory cell.

A current source 7 is provided between the control circuit 5 placed adjacent to the left side of the memory cell array 1a and the control circuit 5 placed adjacent to the right side of the memory cell array 1b. Current sinks 8 are provided side by side with the control circuit 5 placed adjacent to the right side of the memory cell array 1a and with the control circuit 5 placed adjacent to the left side of the memory cell array 1b.

A pair of the current source 7 and the current sink 8 is electrically connected to both ends of at least one of the write lines 4 by the control circuits 5. Then, the current source 7 supplies the write electric current to the connected write line 4, and the current sink 8 draws the write current. Therefore, the write line 4 has only the electric current flowing toward one direction. More specifically, the write line 4 (write line 4a) passing through the memory cell array 1a has only the electric current flowing toward the right direction in FIG. 1, and the write line 4 (write line 4b) passing through the memory cell array 1b has only the electric current flowing toward the left direction in FIG. 1.

The current source 7 is shared by the memory cell arrays 1a and 1b. Therefore, a layout with high integration can be achieved, such that only one constant current source and control circuit of the current source 7 are necessary for the two memory cell arrays 1a and 1b.

Figure 2:
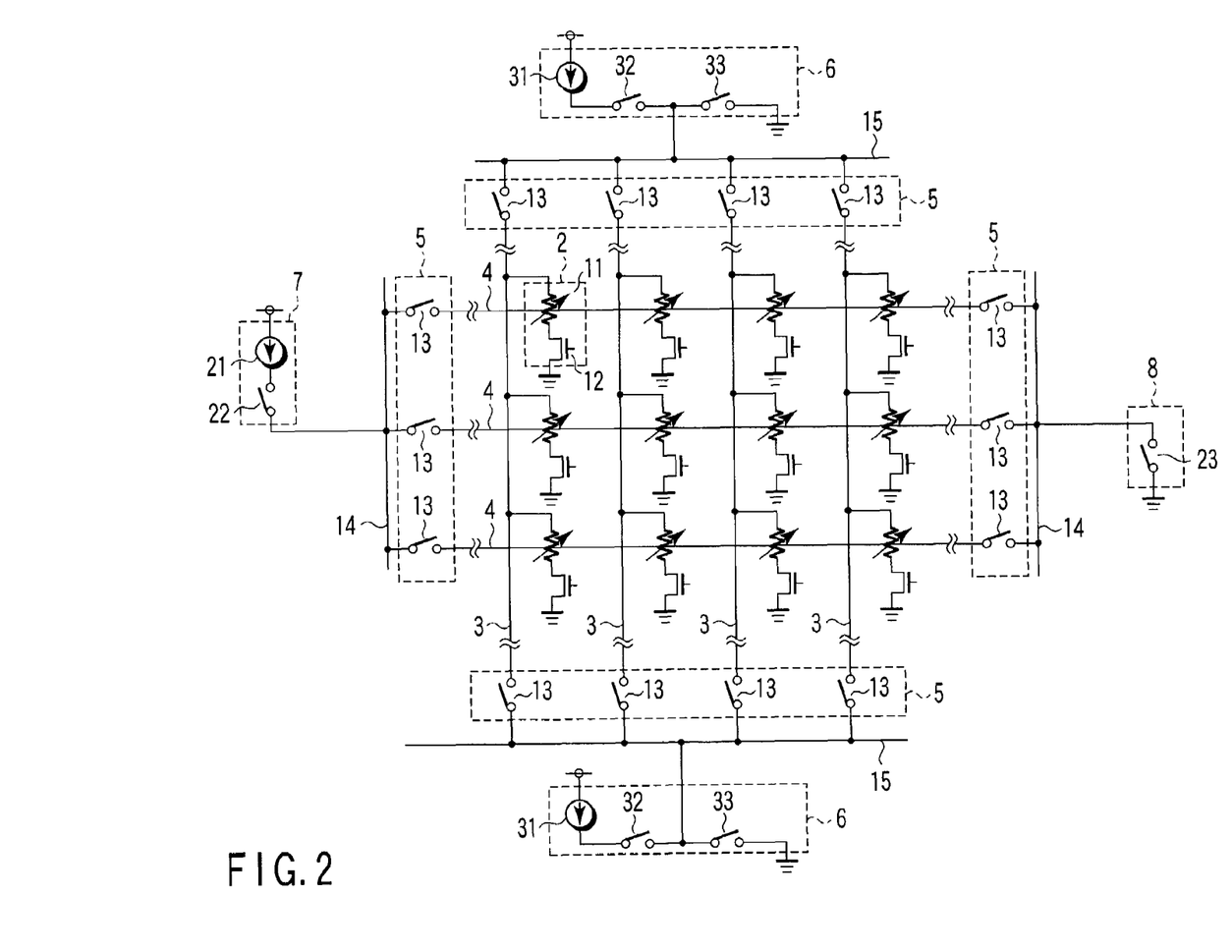
FIG. 2 is a circuit diagram showing an example of a detailed configuration of the magnetic storage device according to the first embodiment.

FIG. 2 is a circuit diagram showing an example of a detailed configuration of FIG. 1. FIG. 2 corresponds to a configuration of the memory cell array 1a. A circuit configuration of the memory cell array 1b is the same as that of the memory cell array 1a, except that the current source 7 and the current sink 8 in FIG. 2 are inversely positioned. Therefore, description of the memory cell array 1b is omitted.

As shown in FIG. 2, each of the memory cells 2 includes a magnetoresistance effect element 11 and a switch element, such as a select transistor 12, connected in series with the magnetoresistance effect element 11. An end of each of the memory cells 2 at the magnet resistance effect element side is connected to the write line 3, and an end at the select transistor 12 is grounded (connected to a common potential end). A gate electrode of the select transistor 12 of each of the memory cells 2 connected to the same write line 4 is connected to a read line (not shown).

Both ends of each of the write lines 3 are connected to common lines 15 through switch circuits 13 including, for example, a transistor. A set of switch circuits 13 constitute the control circuit 5. Both ends of each of the write lines 4 are connected to common lines 14 through the switch circuits 13.

Each of the common lines 15 is connected to the current source/sink 6. The current source/sink 6 includes, for example, a constant current source 31, a switch circuit 32, and a switch circuit 33, which are connected in series. An end of the current source/sink 6 at the switch circuit side is grounded. The common line 15 is connected to a connection node connecting the switch circuit 32 and the switch circuit 33.

One of the two common lines 14 (left one in FIG. 2) is connected to the current source 7. The current source 7 includes, for example, a constant current course 21 and a switch circuit 22, which are connected in series. The other one of the two common lines 14 (right one in FIG. 2) is connected to the current sink 8. The current sink 8 includes, for example, a switch circuit 23, one end of which is grounded.

Figure 3:
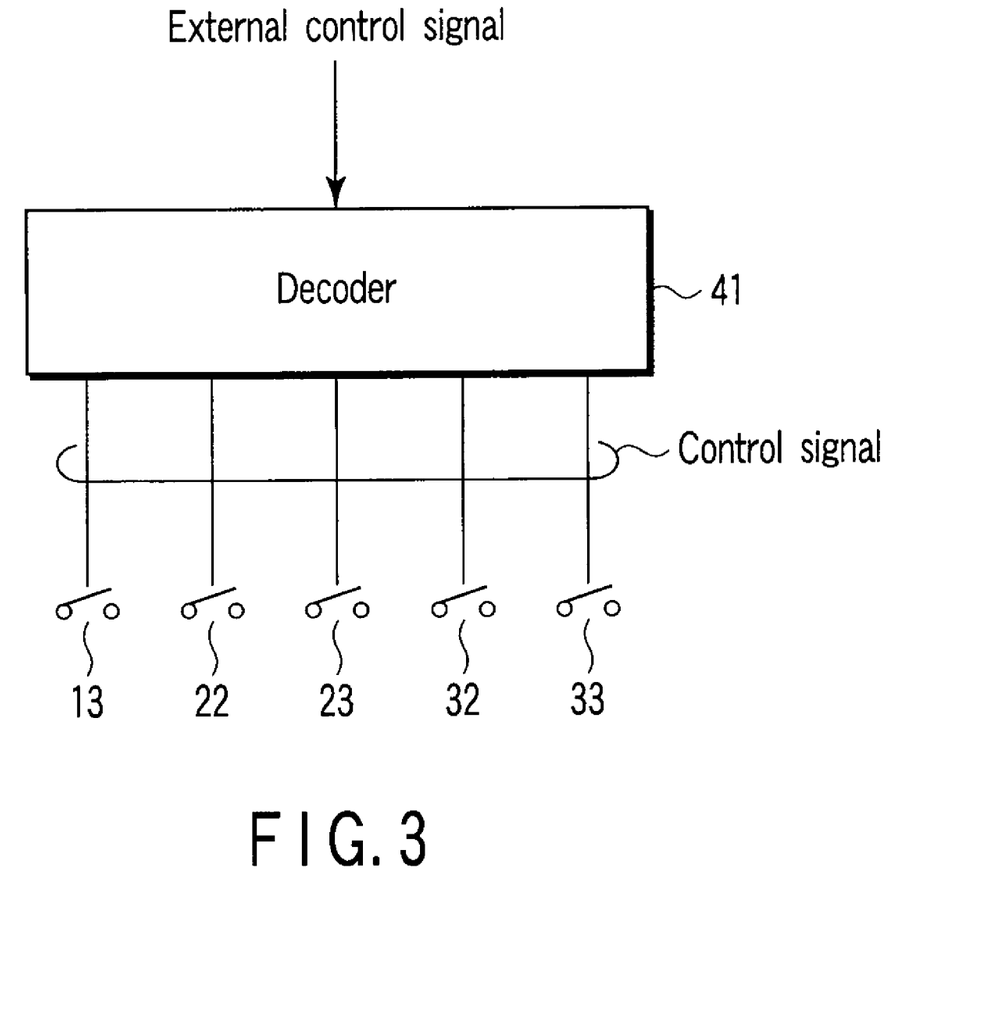
FIG. 3 is a view showing a flow of a control signal toward each switching circuit according to the first embodiment.

As shown in FIG. 3, a control signal is provided to control ends (gate electrodes for transistors) of the switch circuits 13, 22, 23, 32, and 33. The control signal is supplied from a decoder 41. The decoder 41 generates the control signal so that data corresponding to an external control signal is written to the memory cell positioned corresponding to the external control signal, to which the control signal including an address signal is supplied. By the switch circuits 13, 22, 23, 32, and 33 being turned on and off according to the control signal, the electric current of a predetermined direction flows in the write lines 3 and 4 designated by the address signal. Thereby, data is written into the designated memory cells 2.

At the time of reading out, the select transistor 12 of the target memory cells 2 for the readout is turned on, and the current is supplied to the write line 3 connected to the target memory cell 2. A sense amplifier compares a current value or a voltage value with a reference value, thereby data retained by the memory cells 2 is judged.

Figure 4:
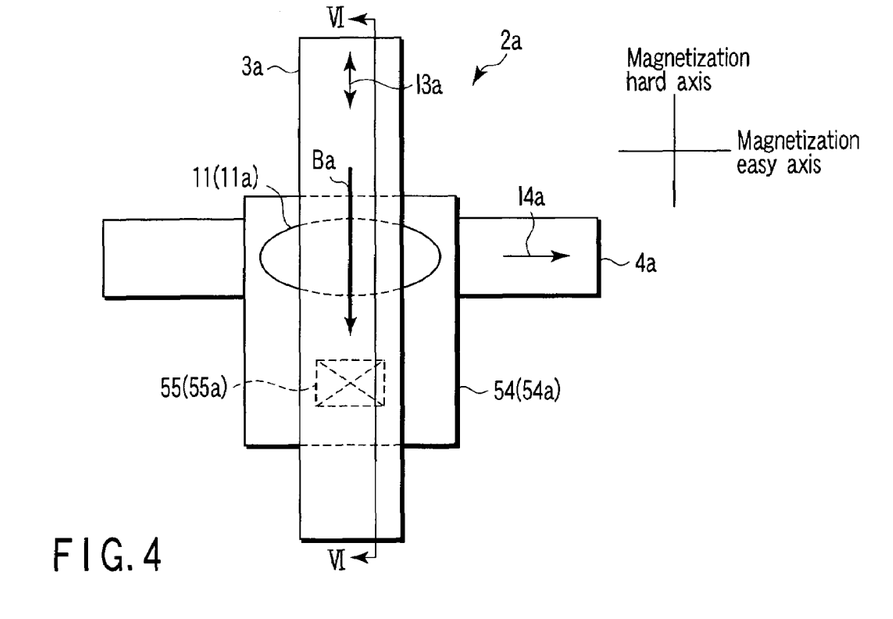
FIGS. 4 and 5 are plan views of a memory cell according to the first embodiment.
Figure 5:
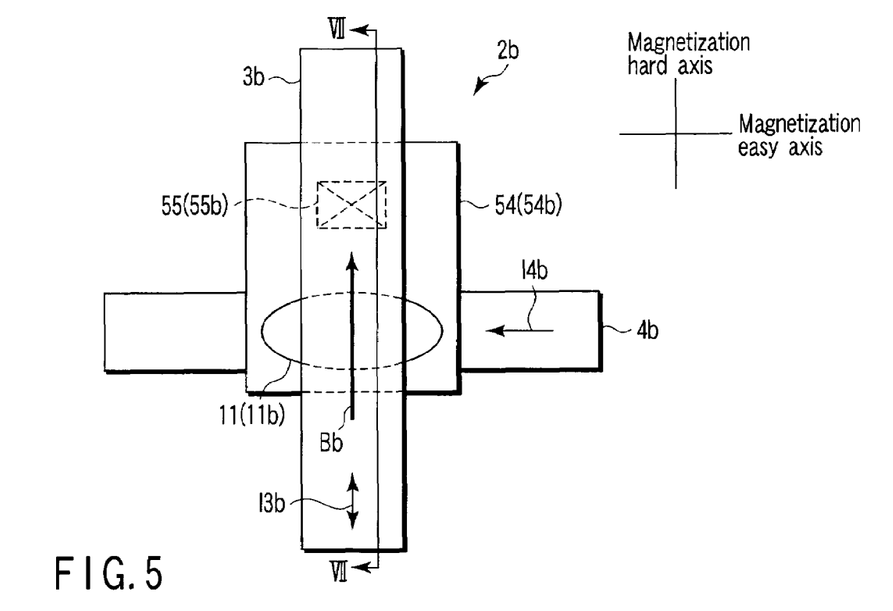

Next, a configuration of the memory cells 2a and 2b will be described with reference to FIGS. 4 to 7. FIG. 4 is a plan view of the memory cell 2a. FIG. 5 is a plan view of the memory cell 2b. All directions of up, down, left, and right in FIGS. 4 and 5 correspond to such directions in FIG. 1. That is, for example, the downside in FIG. 1 is also the downside in FIGS. 4 and 5.

Figure 6:
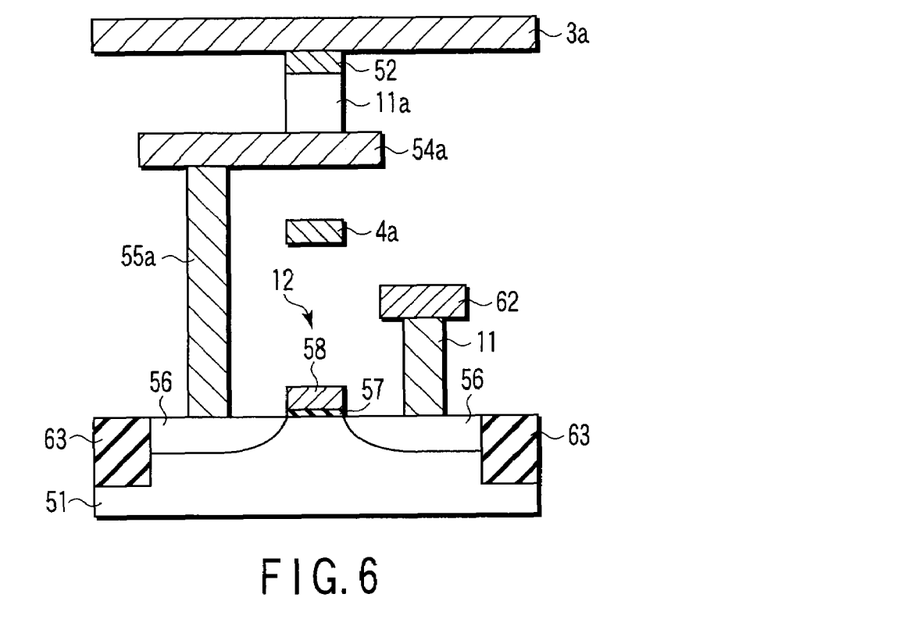
FIGS. 6 and 7 are side views of the magnetic storage device according to the first embodiment.
Figure 7:
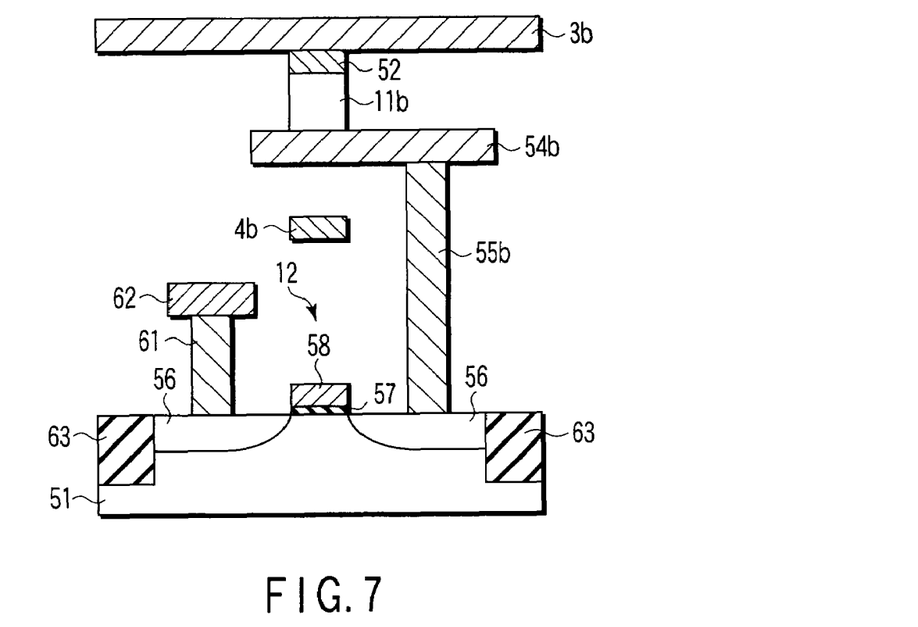

FIG. 6 is a cross-sectional view of FIG. 4 cut along the VI-VI line. FIG. 7 is a cross-sectional view of FIG. 5 cut along the VII-VII line.

As shown in FIGS. 4 to 7, each memory cell 2 includes a top electrode 52, the magnet resistance effect element 11, a bottom electrode 54, and the select transistor 12.

The write lines 3a and 3b are provided above a semiconductor substrate 51. The magnetoresistance effect element 11 of the memory cell 2a (magnetoresistance effect element 11a) and the magnetoresistance effect element 11 of the memory cell 2b (magnetoresistance effect element 11b) are connected to a bottom of each of the write lines 3a and 3b, respectively, via the top electrodes 52. An magnetization easy axis of the magnetoresistance effect element 11 is placed along the extending direction of the write line 4, and a magnetization hard axis is orthogonal to the magnetization easy axis.

Currents I3a and I3b flowing through the write lines 3a and 3b may flow in both directions.

The bottom surface of the magnetoresistance effect elements 11a and 11b is connected to the top surface of the bottom electrode 54 of the memory cell 2a (bottom electrode 54a) and the bottom electrode 54 of the memory cell 2b (bottom electrode 54b), respectively. The cross-sectional area of the bottom electrode 54 is larger than the cross-sectional area of the magnetoresistance effect element 11.

Figure 8:
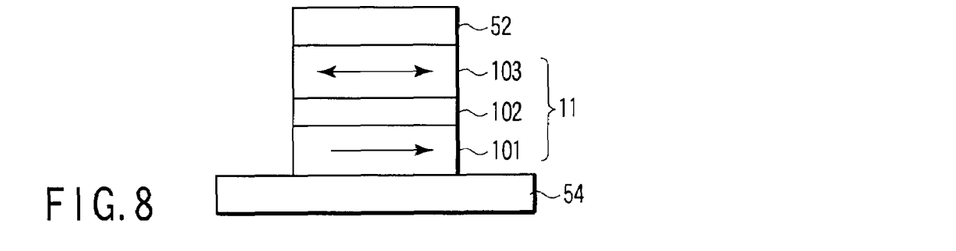
FIGS. 8 and 9 are cross-sectional views of a magnetoresistance effect element.

As shown in FIG. 8, the magnetoresistance effect element 11 includes a fixed layer 101, a nonmagnetic layer 102, and a free layer (recording layer) 103, which are stacked from the bottom. The fixed layer 101 has a laminated ferromagnetic layer and an antiferromagnetic layer. The direction of magnetization of the ferromagnetic layer is fixed along the magnetization easy axis (left and right directions in FIGS. 4 to 7) by the antiferromagnetic layer to give the fixed layer 101 a fixed magnetization as a whole. The bottom surface of the fixed layer 101 touches the top surface of the bottom electrode 54.

The nonmagnetic layer 102 is made by a nonmagnetic material. In order to increase a magnetoresistance effect of the magnetoresistance effect element 11, a material which makes the nonmagnetic layer 102 function as a tunnel barrier layer may be used. As such a material, $AlO_2$ can be exemplified.

The free layer 103 is made by a ferromagnetic material, and the direction of magnetization is variable. The magnetization easy axis of the free layer 103 extends along the easy axis of magnetization of the fixed layer 101. The top surface of the free layer 103 touches the bottom surface of the top electrode.

Figure 9:
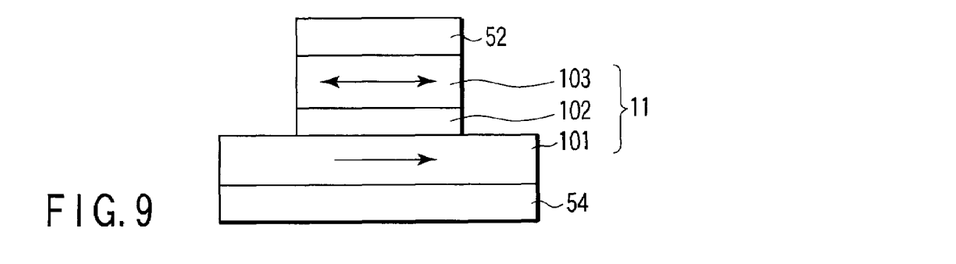

The magnetoresistance effect element 11 may have a structure shown in FIG. 9. As shown in FIG. 9, the fixed layer 101 has a plane form which is the same as the bottom electrode 54.

As shown in FIGS. 4 to 7, the write lines 4a and 4b are provided below the bottom electrodes 54a and 54b, and directly below the magnetoresistance effect elements 11a and 11b, respectively. Write currents I4a and I4b flowing through the write lines 4a and 4b flow in only one direction. Therefore, a downward magnetic field Ba is applied to the memory cell 2a by the write current I4a, and an upward magnetic field Bb is applied to the memory cell 2b by the write current I4b. The bottom electrodes 54a, 54b and a surface of the semiconductor substrate 51 are connected by a plug 55 of the memory cell array 2a (plug 55a) and a plug 55 of the memory cell array 2b (plug 55b), respectively.

The magnetoresistance effect element 11a is placed in an upper half area of the bottom electrode 54a in FIG. 4 (right half area of the bottom electrode 54a in FIG. 6). The plug 55a is placed in a lower half area of the bottom electrode 54a in FIG. 4 (left half area of the bottom electrode 54a in FIG. 6).

On the other hand, the magnetoresistance effect element 11b is placed in a lower half area of the bottom electrode 54b in FIG. 5 (left half area of the bottom electrode 54b in FIG. 7). The plug 55b is placed in an upper half area of the bottom electrode 54b in FIG. 5 (right half area of the bottom electrode 54b in FIG. 7).

The forms of the magnetoresistance effect element 11, the write line 3, the write line 4, the bottom electrode 54, and plug 55 are substantially the same regardless of the memory cells 2. Here, "same" means that each part is formed under an expectation that the same form can be obtained by the same process, and errors are tolerated.

Since the memory cells 2a and 2b have the configuration as described above, the memory cells have a symmetrical relationship about an imaginary axis parallel to the magnetization easy axis. That is, the relative positional relationship of the forms of the write lines 3 and 4, the magnetoresistance effect element 11, and the bottom electrode 54 is the same in all the memory cells 2a and 2b.

As shown in FIGS. 6 and 7, the position on the semiconductor substrate 51 which the plug 55 touches is provided with one of a pair of source/drain diffusion regions 56. The other one of the source/drain diffusion regions 56 is connected to an interconnect 62 with a plug 61 interposed therebetween.

A gate insulating film 57 is provided on the semiconductor substrate 51 in the position between the pair of the source/drain diffusion regions 56. A gate electrode 58 is provided on the gate insulating film 57. The source/drain diffusion regions 56, the gate insulating film 57, and the gate electrode 58 configure the select transistor 12. An element isolation insulating film 63 is also provided on the surface of the semiconductor substrate 51.

According to the magnetic storage device of the first embodiment, the memory cell 2a and the memory cell 2b have a relationship of mirror symmetry. For this reason, even if the directions of the magnetic fields Ba and Bb (collectively, magnetic fields B) are different between the memory cells 2a and 2b, the magnetic fields Ba and Bb are applied to the magnetoresistance effect elements 11a and 11b and the bottom electrodes 54a and 54b in all the memory cells 2a and 2b in a similar manner.

More specifically, the magnetic fields Ba and Bb which are headed along directions from the magnetic resistance effect elements 11a and 11b to the plugs 55a and 55b along the bottom electrodes 54a and 54b are applied to any of the magnetoresistance effect elements 11a and 11b. As a result, interactions of the bottom electrodes 54a and 54b with the magnetic fields Ba and Bb are standardized between the memory cells 2a and 2b. Therefore, write characteristics to the memory cells 2a and 2b are standardized, and the magnetic storage device having large margins for writing between the memory cells 2a and 2b can be realized.

The first embodiment does not always require that each part of the memory cells 2a and 2b are mirror-symmetrical. If the form and orientation of each part are the same among the memory cells 2, the first embodiment only requires that at least a relative positional relationship of the write line 4, the bottom electrode 54 and the magnetoresistance effect element 11, and the direction of the magnetic fields B to the bottom electrode 54 and the magnetoresistance effect element 11, are the same among the memory cells 2. With this configuration, the magnetic fields B are applied along the direction from the magnetoresistance effect element 11 to the plug 55 on the bottom electrode 54 in all the memory cells 2. As a result, the magnetic storage device can secure larger margins for writing than a magnetic storage device in which the position of the magnetoresistance effect element on the bottom electrode, and the direction of the magnetic field being fixed to the bottom electrode and the magnetoresistance effect element, are not standardized among the memory cells.

Nevertheless, in addition to the above, if the positions of the magnetoresistance effect elements 11a and 11b in the bottom electrodes 54a and 54b are also mirror-symmetrical, the effect of standardizing the write characteristics is even higher.

The first embodiment is particularly effective when the plane form of the fixed layer 101 is the same as that of the bottom electrode 54 as shown in FIG. 9. That is, the magnetoresistance effect element having such configuration has the write characteristics varying significantly among the memory cells due to a leakage magnetic field, if how the leakage magnetic field are applied from the fixed layer to the magnetoresistance effect element varies. On the contrary, according to the first embodiment, even if the magnetoresistance effect elements 11a and 11b having the configuration of FIG. 9 is used, the ways of influence of the leakage magnetic field from the bottom electrodes 54a and 54b are standardized among all the memory cells 2a and 2b. Therefore, large margins for writing can be secured.

Second Embodiment

The second embodiment is different from the first embodiment in the form of the bottom electrode.

Figure 10:
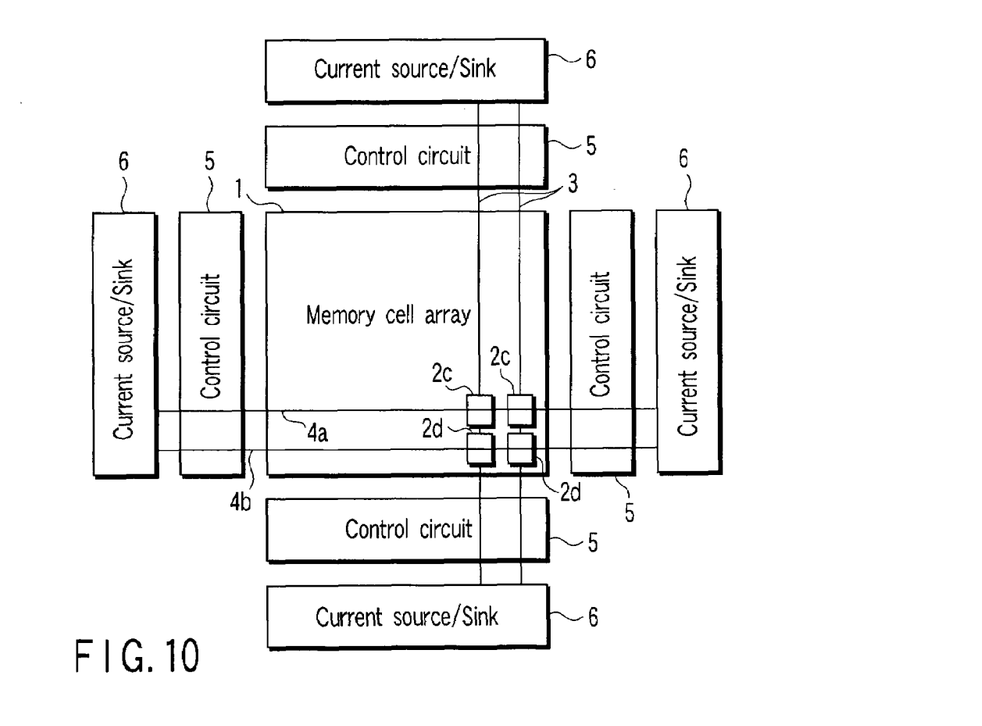
FIG. 10 is a block diagram of the magnetic storage device according to a second embodiment.
Figure 11:
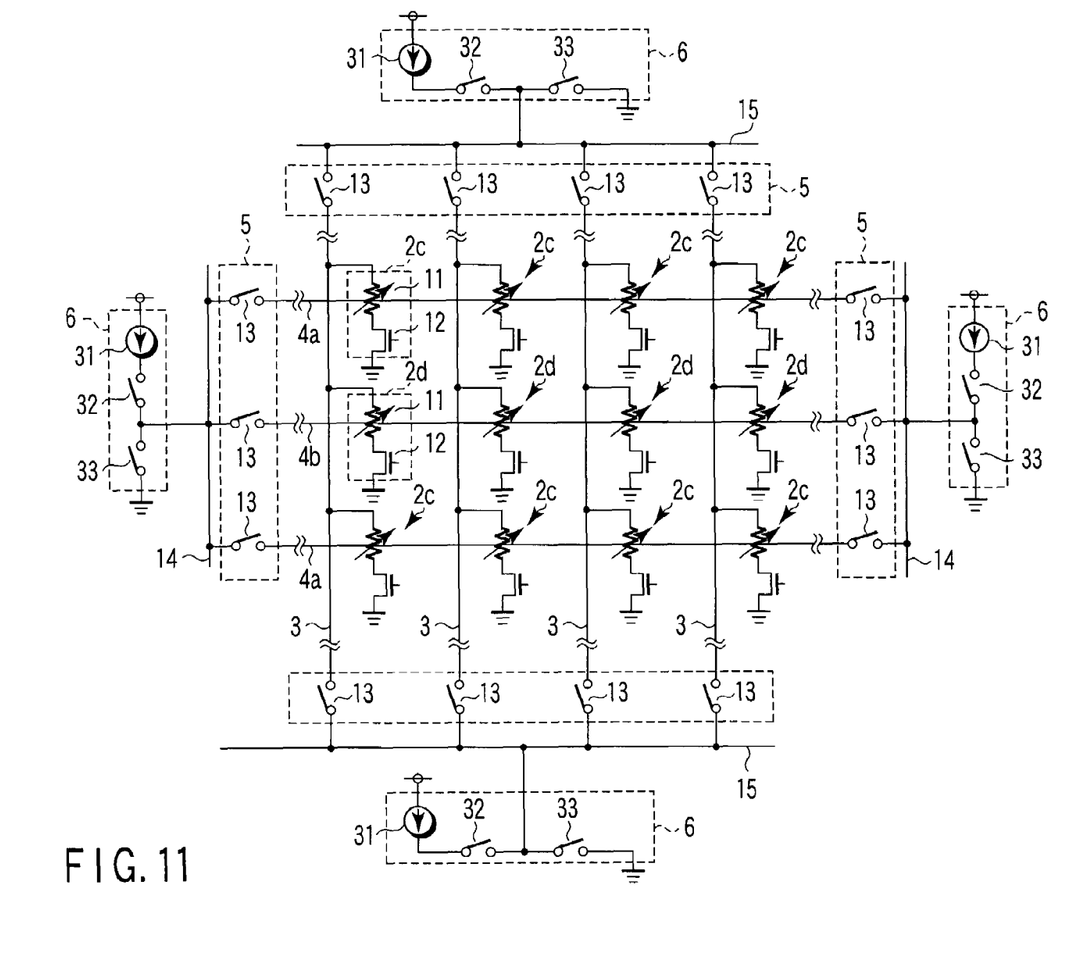
FIG. 11 is a circuit diagram showing an example of a detailed configuration of the magnetic storage device according to the second embodiment.

The second embodiment will be described with reference to FIGS. 10 to 12. FIG. 10 is a block diagram of the magnetic storage device according to the second embodiment. FIG. 11 is a circuit diagram showing an example of a detailed configuration of FIG. 10. As shown in FIGS. 10 and 11, the write lines 4a and 4b extending along the left-and-right direction in the drawings are provided alternately along the up-and-down direction in the drawings.

The second embodiment is configured to have the write current flow in both directions also in the write lines 4. That is, the current sources/sinks 6 are provided side by side with the control circuits 5 on both sides of the memory cell array 1.

The current sources/sinks 6 on the right and left of the memory cell array 1 are electrically connected to the write line 4 through the control circuits 5 on the right and left of the memory cell array 1. The pair of the current sources/sinks 6 are electrically connected to both ends of at least one of the write lines 4 by the control circuits 5.

Corresponding to a control signal (not shown), one of the pair of the current sources/sinks 6 connected to both ends of the write line 4 supplies electric currents to the write line 4, and the other draws the electric currents from the write line 4. The direction of the current flowing through the write lines 4 is unique depending on the write line 4. In the write line 4a, the current flows towards the right in the drawings. In the write line 4b, the current flows towards the left in the drawings.

The memory cell array 1 includes memory cells 2c and 2d. The memory cells 2c and 2d have a plane form different from that in the first embodiment as described later. The memory cell 2c is provided to the write lines 4a, and the memory cell 2d is provided to the write lines 4b adjacent to one of the write lines 4a. Therefore, the memory cells 2c and 2d are placed alternately along each of the write lines 3.

In each current sources/sink 6 on the left and right of the memory cell array 1, a connection node of the switch circuit 32 and the switch circuit 33 is connected to the common line 14.

Other configurations are the same as those in the first embodiment.

Next, configurations of the memory cells 2c and 2d will be described with reference to FIG. 12. FIG. 12 is a plan view of the memory cells 2c and 2d. The directions of up, down, left, and right in FIG. 12 match with such directions in FIG. 10. That is, for example, the downside in FIG. 10 is also the downside in FIG. 12.

Figure 12:
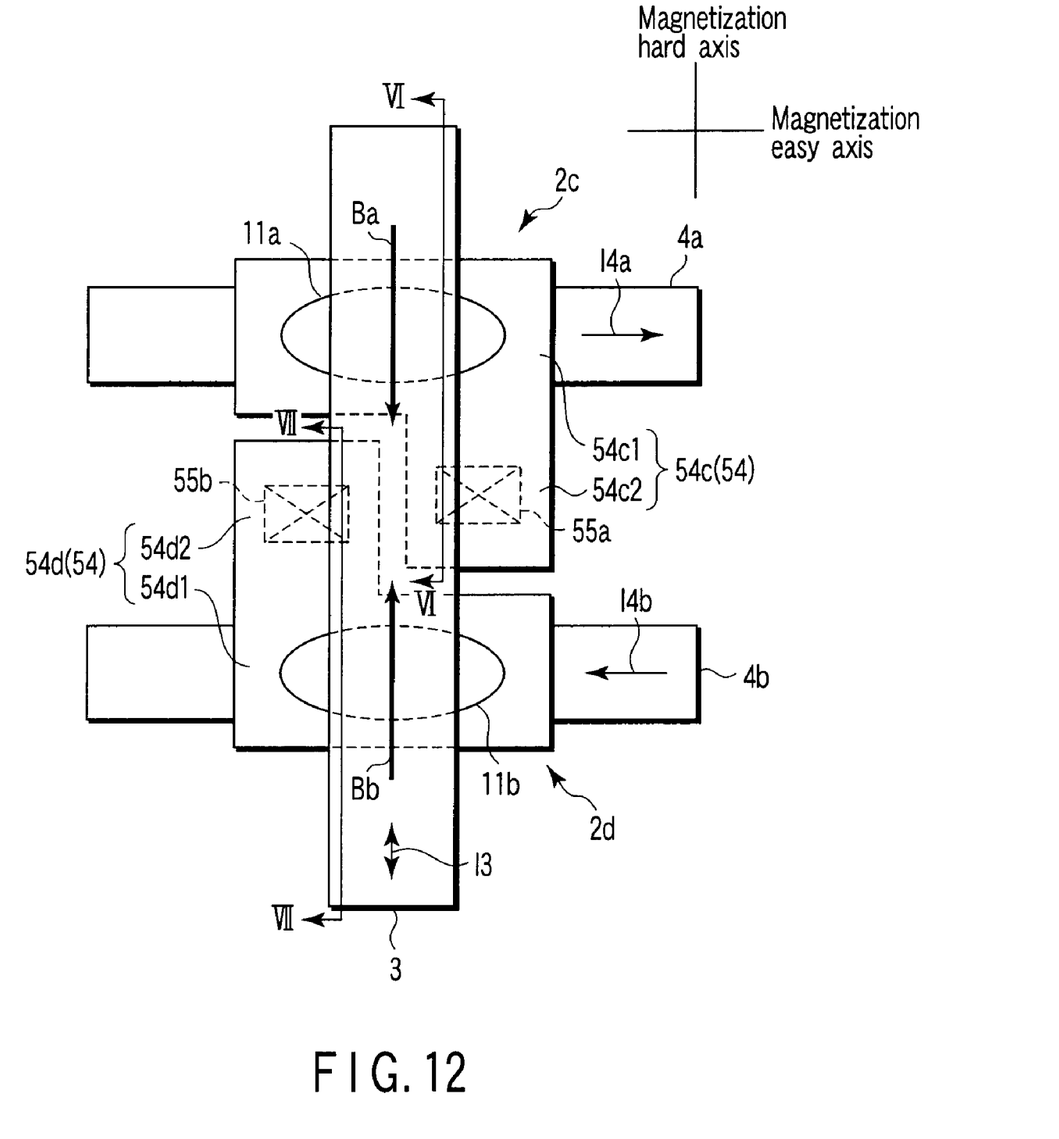
FIG. 12 is a plan view of the memory cell according to the second embodiment.

As shown in FIG. 12, the memory cell 2c includes the magnetoresistance effect element 11a, the bottom electrode 54c, and the plug 55a, and the memory cell 2d includes the magnetoresistance effect element 11b, the bottom electrode 54d, and the plug 55b.

The adjacent two memory cells 2c and 2d configure one set, with the memory cell 2c on the upper side and the memory cell 2d on the lower side. The memory cells 2c and 2d are provided on the bottom electrodes 54c and 54d, respectively.

The bottom electrodes 54c and 54d have a relationship of rotational symmetry (point symmetry). Examples having such a relationship include the bottom electrodes 54c and 54d with a form described below.

The plan form of the bottom electrode 54c has the L-shape rotated for 180 degrees. The bottom electrode 54c includes a part 54c1 extending along the left-and-right direction and a part 54c2 extending along the up-and-down direction. The part 54c1 is placed on the upper side and the part 54c2 is placed on the lower side in FIG. 12. The plug 55a is connected to the part 54c2. The magnetoresistance effect element 11a is placed between the write line 3 and the write line 4a, and the magnetization easy axis of the magnetoresistance effect element 11a extends along the write line 4a.

The plan form of the bottom electrode 54d has the L-shape. The bottom electrode 54d includes a part 54d1 extending along the left-and-right direction and a part 54d2 extending along the up-and-down direction. The part 54d1 is placed on the lower side and the part 54d2 is placed on the upper side in FIG. 12. The plug 55b is connected to the part 54d2. The magnetoresistance effect element 11b is placed between the write line 3 and the write line 4b, and the magnetization easy axis of the magnetoresistance effect element 11b extends along the write line 4b.

The left side of the part 54c2 faces the right side of the part 54d2, and the lower side of the part 54c2 faces the upper side of the part 54d1. The upper side of the part 54d2 faces the lower side of the part 54c1.

Since the current I4a flows in the write line 4a toward the right, the magnetic field Ba by the current I4a is directed toward the lower direction in the magnetoresistance effect element 11a. Since the current I4b flows in the write line 4b toward the left, the magnetic field Bb by the current I4b is directed toward the upper direction in the magnetoresistance effect element 11b.

As for cross-sectional shapes of the memory cells 2c and 2d, the cross-sectional shape cut along the VI-VI line is shown in FIG. 6 and the cross-sectional shape cut along the VII-VII line is shown in FIG. 7. Configurations of the magnetoresistance effect elements 2c and 2d may be any of the configurations in FIGS. 8 and 9.

The memory cells 2c and 2d have the configurations described above, and have a relationship of point symmetry.

According to the magnetic storage device of the second embodiment, the bottom electrodes 54c and 54d, under which the adjacent write lines 4a and 4b respectively pass, are of point symmetry to each other. In addition to that, the write currents I4a and I4b flow in the write lines 4a and 4b in fixed directions which are opposite to each other. Therefore, even if the forms of the bottom electrodes 54c and 54d are different from each other, the magnetic fields Ba and Bb are applied to the magnetoresistance effect elements 11a and 11b and the bottom electrodes 54c and 54d in a similar manner in all the memory cells 2c and 2d.

More specifically, the magnetic fields Ba and Bb directed from the magnetoresistance effect element to the plugs 55a and 55b on the bottom electrodes 54c and 54d are applied to any of the magnetoresistance effect elements 11a and 11b. As a result, interactions of the bottom electrodes 54c and 54d with the magnetic fields Ba and Bb are standardized between the memory cells 2c and 2d. Therefore, write characteristics to the memory cells 2c and 2d are standardized, and the magnetic storage device having large margins for writing between the memory cells 2c and 2d can be realized.

Similar to the first embodiment, as long as at least a relative positional relationship of the write lines 3, the bottom electrodes 54, and the magnetoresistance effect elements 11, and the direction of the magnetic fields B toward the bottom electrode 54 and the magnetoresistance effect element 11, are the same among the memory cells 2, margins of writing can be increased.

The second embodiment is also especially effective when the plane shapes of the fixed layer 101 and the bottom electrodes 54c and 54d are the same, for the same reasons described in the first embodiment.

Third Embodiment

The third embodiment relates to an application of a toggle write system to the first embodiment.

In the toggle write type, as disclosed by the specification of U.S. Pat. No. 6,545,906, the magnetization easy axis of each of the magnetoresistance effect element extends along the direction at an angle of 45 degrees with respect to both two types of the write lines on a plane made by the two types of the write lines. Then, the configuration of the magnetoresistance effect element and a timing of feeding the write current are different from a conventional magnetic storage device.

Figure 13:
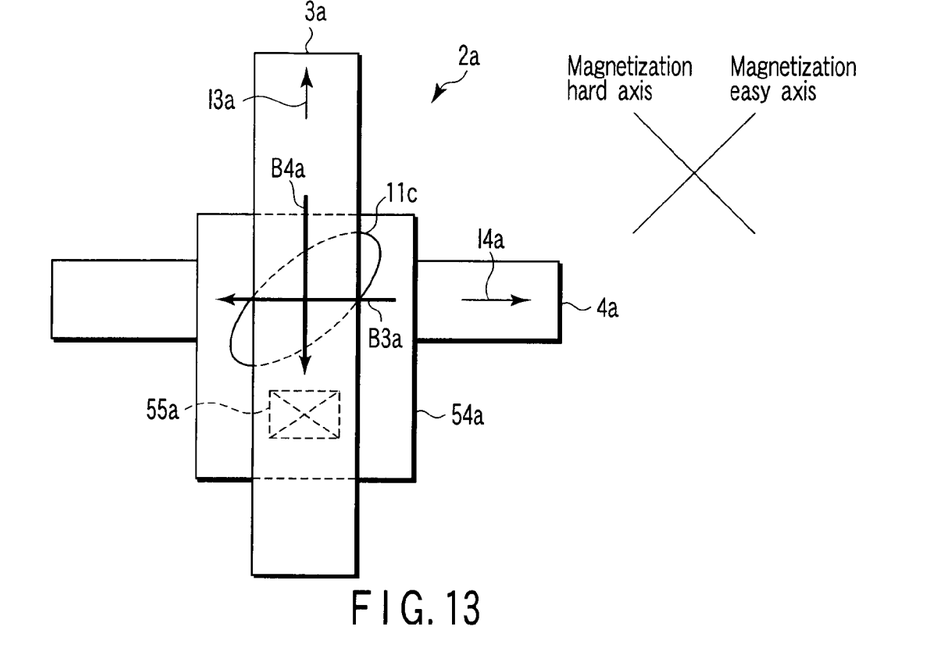
FIGS. 13 and 14 are plan views of the memory cell according to a third embodiment.
Figure 14:
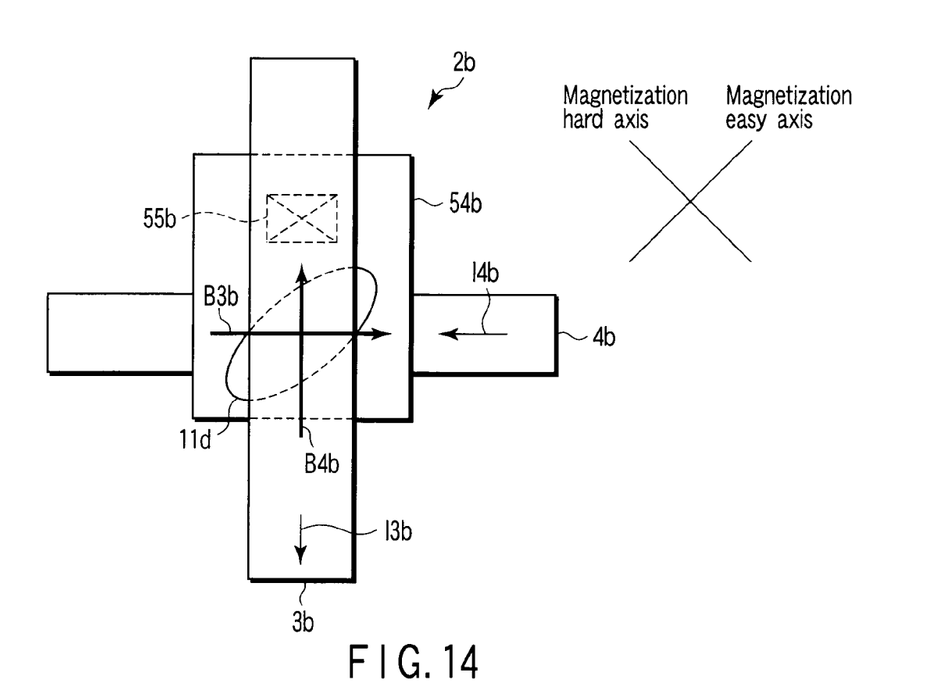

FIGS. 13 and 14 show a plan view of the memory cell according to the third embodiment, and show the application of the toggle write method to the first embodiment. FIG. 13 shows the memory cell (corresponding to the memory cell 2a) provided in the memory cell array 1a in FIG. 1. FIG. 14 shows the memory cell (corresponding to the memory cell 2b) provided in the memory cell array 1b in FIG. 1. The cross-sectional structure is the same as the first embodiment.

As shown in FIGS. 13 and 14, the memory cells 2a and 2b in the third embodiment are the same as those in the first embodiment, except that the memory cells 2a and 2b in the third embodiment include magnetoresistance effect elements 11c and 11d, respectively in place of the magnetoresistance effect elements 11a and 11b.

The magnetoresistance effect element 11c is provided on the bottom electrode 54a. The magnetization easy axis of the magnetoresistance effect element 11c extends along the direction at an angle of 45 degrees with respect to both of the write lines 3a and 4a. The magnetization hard axis is orthogonal to the magnetization easy axis. Therefore, a magnetic field B3a by the write line 3a and a magnetic field B4a by the write line 4a have an angle of 45 degrees with respect to the magnetization easy axis and the magnetization hard axis.

The magnetoresistance effect element 11d is provided on the bottom electrode 54b. The magnetization easy axis of the magnetoresistance effect element 11d extends along the direction at an angle of 45 degrees with respect to both the write lines 3b and 4b. The magnetization hard axis is orthogonal to the magnetization easy axis. Therefore, a magnetic field B3b by the write line 3b and a magnetic field B4b by the write line 4b have an angle of 45 degrees with respect to the magnetization easy axis and the magnetization hard axis.

The easy axes of magnetization of the magnetoresistance effect elements 11 (magnetoresistance effect elements 11c and 11d) extend along the same direction.

Since the memory cells 2 (memory cells 2c and 2d) have the configurations described above, they are of mirror symmetry.

Figure 15:
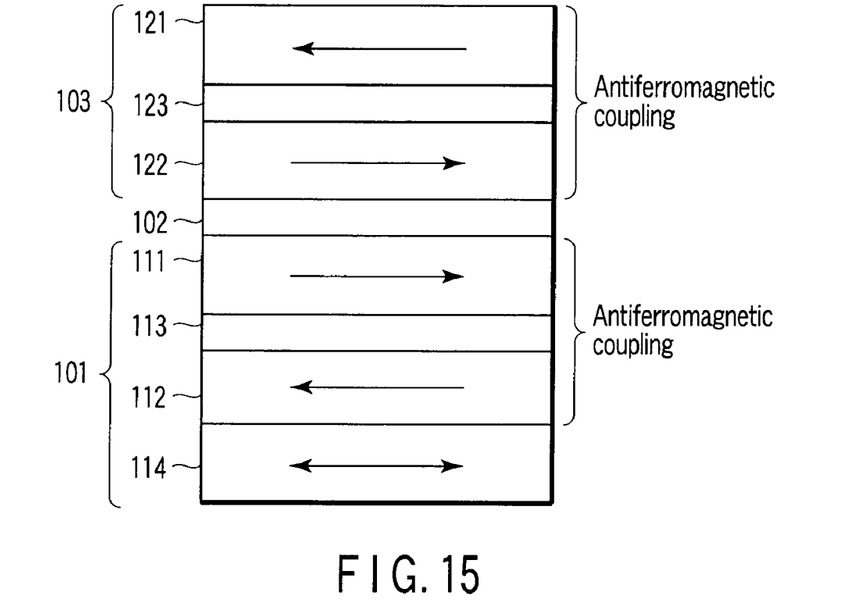
FIGS. 15 and 16 are side views of the magnetoresistance effect element according to the third embodiment.
Figure 16:
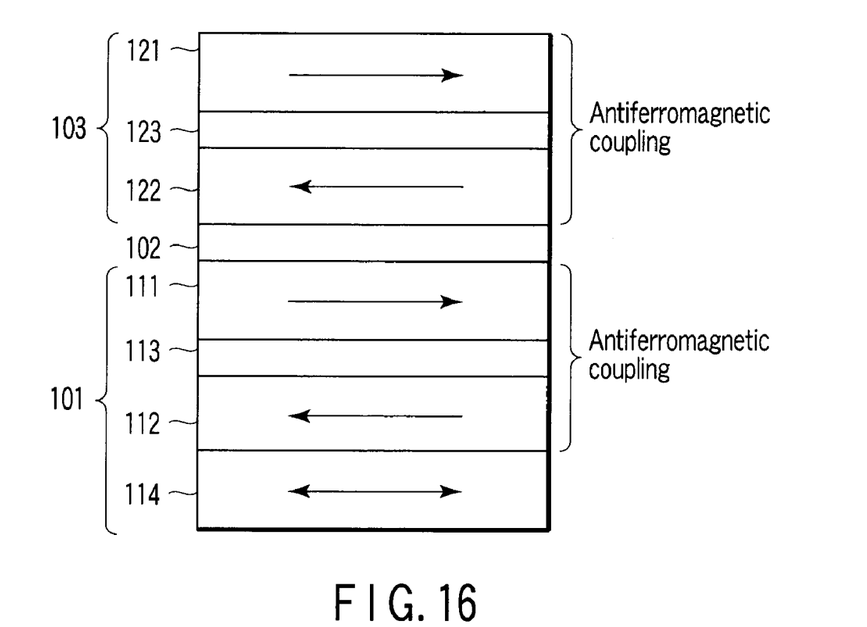

The magnetoresistance effect elements 11c and 11d have configurations shown in FIGS. 15 and 16. FIGS. 15 and 16 are side views schematically showing configurations of an MTJ element which can be used for a toggle MRAM. FIG. 15 shows a state in which directions of magnetization of a free layer and a pinned layer are parallel. FIG. 16 shows a state in which directions of magnetization of the free layer and the pinned layer are antiparallel.

As shown in FIGS. 15 and 16, the fixed layer 101 includes two ferromagnetic layers 111 and 112 of a ferromagnetic metal, a paramagnetic layer 113 of a paramagnetic metal interposed between the ferromagnetic layers 111 and 112, and an antiferromagnetic layer 114 of an antiferromagnetic metal. A structure including the ferromagnetic layers 111 and 112 and the paramagnetic layer 113 is provided on the antiferromagnetic layer 114. The two ferromagnetic layers 111 and 112 are antiferromagnetically coupled.

The free layer 103 has two ferromagnetic layers 121 and 122 of a ferromagnetic metal and a paramagnetic layer 123 of a paramagnetic metal interposed between the ferromagnetic layers. The two ferromagnetic layers 121 and 122 are antiferromagnetically coupled.

As shown in FIG. 15, in a parallel state, the magnetization directions of two of the ferromagnetic layers 111 and 122 sandwiching the nonmagnetic layer 102 are parallel. As shown in FIG. 16, in a non-parallel state, the magnetization directions of two of the ferromagnetic layers 111 and 122 sandwiching the nonmagnetic layer 102 are antiparallel.

First, data of the target magnetoresistance effect element for the writing is read out for writing with the toggle write system. If the read-out data and the write data match up, the writing is not carried out. When both of the data do not match up, the writing is carried out.

In the toggle write system, carrying out writing changes a state of the MTJ element regardless of a state of the magnetoresistance effect element before the writing. For example, carrying out writing makes the magnetoresistance effect element in the antiparallel state to be in the parallel state, and the magnetoresistance effect element in the parallel state changes to be in the antiparallel state.

Inversion of the state of the magnetoresistance effect element can be carried out only by feeding the write currents I3a and I3b to the write lines 3a and 3b, and the write currents I4a and I4b to the write lines 4a and 4b, respectively.

The directions that the currents I3a, I3b, I4a, and I4b flow in are fixed regardless of the write data. In addition, the directions of the currents I4a and I4b set to be opposite against each other, respectively. For example, as shown in FIGS. 13 and 14, the current I3a flows to the upward direction, the current I4a flows to the rightward direction, the I3b flows to the downward direction, and the I4b flows to the leftward direction.

Figure 17:
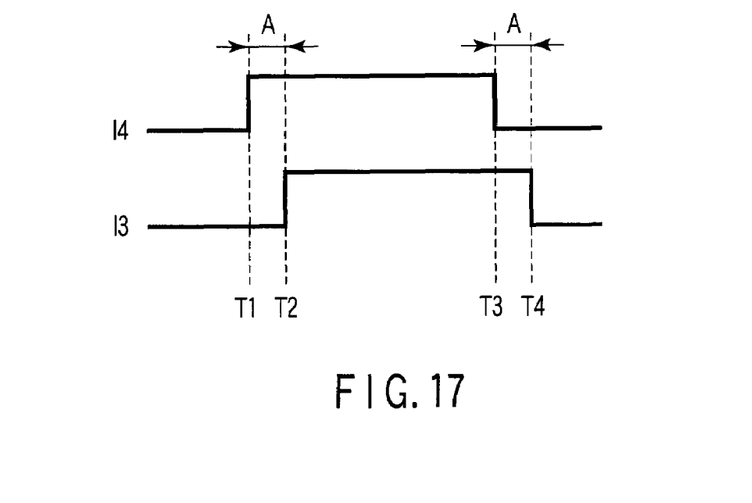
FIG. 17 is a timing chart for a write electric current.

The timing of feeding the currents I3 (currents I3a and I3b) and the currents I4 (currents I4a and I4b) is shown in FIG. 17, for example. As shown in FIG. 17, supply of the currents I4 starts at a time T1. The supply of the currents I4 is maintained.

Next, supply of the currents I3 starts at a time T2 after a period A elapses from the time T1. Thereafter, the supply of the currents I3 and I4 continue until a time T3. Next, at the time T3, the supply of the currents I4 is stopped. The supply of the currents I3 is then stopped at a time T4.

Supply of the currents thus described inverts the states of the magnetoresistance effect elements 11c and 11d.

The timing of starting the supply of the currents I3 may be set earlier than the timing of starting the supply of the currents I4 for a certain delay time A.

According to the magnetic storage device of the third embodiment, the memory cells 2c and 2d are of mirror symmetry as same as the first embodiment, and the directions of the currents I3a and I3b, and the directions of the currents I4a and I4b are opposite against each other, respectively. As a result, interactions of the bottom electrodes 54a and 54b with the magnetic fields Ba (B3a and B4a) and Bb (B3b and B4b) are standardized between the memory cells 2a and 2b. Therefore, write characteristics to the memory cells 2a and 2b are standardized, and the magnetic storage device having large margins for writing between the memory cells 2a and 2b can be realized.

Similar to the first embodiment, as long as at least a relative positional relationship among the write lines 3 and 4, the bottom electrode 54, and the magnetoresistance effect element 11, the directions of the magnetic fields B3 (B3a and B3b) to the bottom electrode 54 and the magnetic resistance effect element 11, and the directions of the magnetic fields B4 (B4a and B4b) to the bottom electrode 54 and the magnetic resistance effect element 11 match up among the memory cells 2, margins of writing can be increased.

Fourth Embodiment

The fourth embodiment relates to an application of the toggle write system to the second embodiment.

Figure 18:
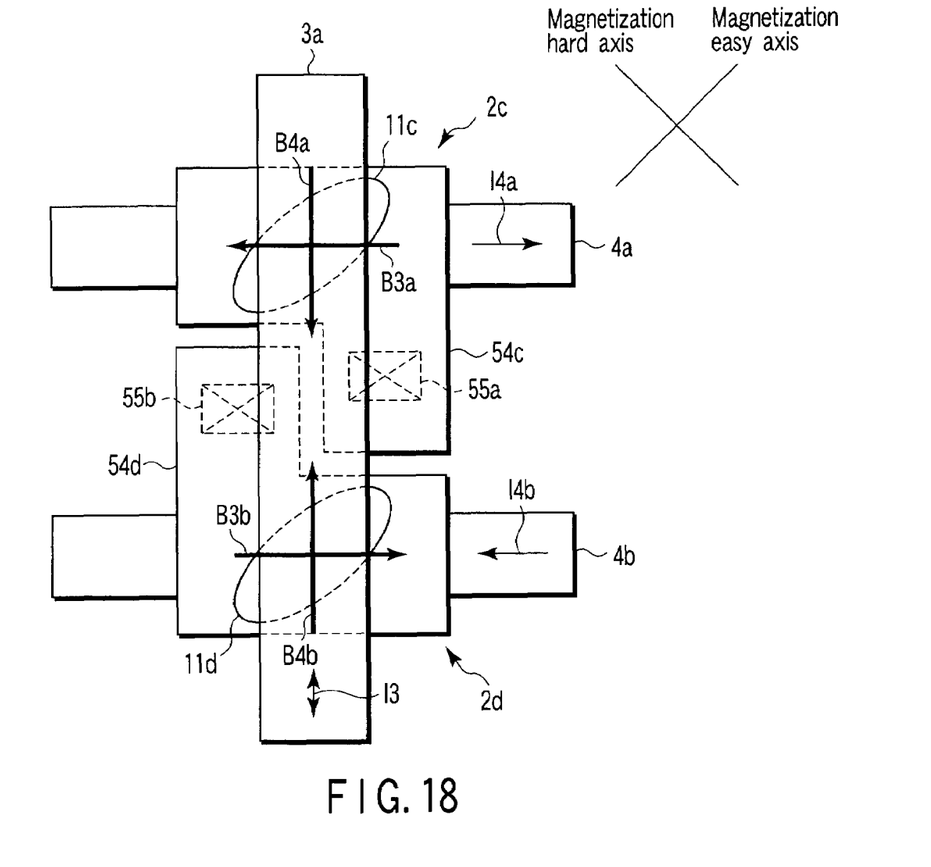
FIG. 18 is a plan view of the memory cell according to a fourth embodiment.

FIG. 18 shows a plan view of the memory cell according to the fourth embodiment, and shows an application of the toggle write system to the second embodiment. The cross-sectional structure is the same as that in the first embodiment.

As shown in FIG. 18, the memory cells 2c and 2d in the fourth embodiment are the same as those in the second embodiment, except that the memory cells 2c and 2d in the fourth embodiment include the magnetoresistance effect elements 11c and 11d in place of the magnetoresistance effect element 11a and 11b, respectively.

The magnetoresistance effect elements 11c and 11d are provided on the bottom electrodes 54c and 54d, respectively. The magnetization easy axis and the magnetization hard axis of the magnetoresistance effect elements 11c and 11d extend along the direction at an angle of 45 degrees with respect to both the write lines 3a and 4a. In addition, the easy axes of magnetization of the magnetoresistance effect elements 11c and 11d extend along the same direction.

The memory cells 2c and 2d have the configurations as described above, and have a relationship of point symmetry.

The direction the write currents I3 flow in is different between writing for the memory cell 2c and for the memory cell 2d. More specifically, the currents I3 flow in the downward direction for writing into the memory cell 2c and flow in the upward direction for writing into the memory cell 2d. Other writing operations are the same as the operations described by using FIGS. 13 and 14.

According to the magnetic storage device of the fourth embodiment, as same as the second embodiment, the bottom electrodes 54c and 54d under which the adjacent write lines 4a and 4b respectively pass, are of point symmetry, and the directions of the currents I3a and I3b, and the directions of the currents I4a and I4b are opposite against each other, respectively. As a result, interactions of the bottom electrodes 54c and 54d with the magnetic fields Ba (B3a and B4a) and Bb (B3b and B4b) are standardized between the memory cells 2c and 2d. Therefore, write characteristics to the memory cells 2c and 2d are standardized, and the magnetic storage device having large margins for writing between the memory cells 2c and 2d can be realized.

Similar to the first embodiment, as long as at least a relative positional relationship among the write lines 3 and 4, the bottom electrode 54, and the magnetoresistance effect element 11, the directions of the magnetic fields B3 (B3a and B3b) to the bottom electrode 54 and the magnetic resistance effect element 11, and the directions of the magnetic fields B4 (B4a and B4b) to the bottom electrode 54 and the magnetic resistance effect element 11 match up among the memory cells 2, margins of writing can be increased.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic storage device comprising:
a memory cell array having magnetoresistance effect elements placed in a matrix;
a first write line extending along a first direction, current being supplied to flow in the first write line only in the first direction;
a second write line extending along the first direction, current being supplied to flow in the second write line only in the second direction opposite to the first direction;
a third write line extending along a third direction which is orthogonal to the first direction, the magnetoresistance effect elements being placed where the first and third write lines cross and where the second and third write lines cross;
a first electrode provided between the first and third write lines;
a first plug connected to the first electrode and provided at a location apart from the first write line along the third direction;
a second electrode provided between the second and the third write lines; and
a second plug connected to the second electrode and provided at a location apart from the second write line along an opposite direction to the third direction.

2. The device according to claim 1, wherein
the first electrode and second electrode have a same form, and
the magnetoresistance effect elements have a same form.

3. The device according to claim 2, wherein
the first and second electrodes are of symmetry about the first write line.

4. The device according to claim 3, wherein
a relative positional relationship of one of the magnetoresistance effect elements between the first and third write lines, the first write line and the first electrode is a same as a relative positional relationship of one of the magnetoresistance effect elements between the second and third write lines, the second write line and the second electrode.

5. The device according to claim 2, wherein
the first and second write lines are adjacent to each other along the third direction, and
the first and second electrodes are of point symmetry.

6. The device according to claim 5, wherein
a relative positional relationship among one of the magnetoresistance effect elements which are located between the first and third write lines, the first write line and the first electrode is a same as a relative positional relationship among one of the magnetoresistance effect elements which are located between the second and third write lines, the second write line and the second electrode.

7. The device according to claim 1, wherein
the memory cell array includes a first part and a second part, each of which includes the magnetoresistance effect elements,
the third write line and an additional third line identical to the third line are provided for the first part and the second part of the memory cell array, respectively,
the first write line is provided for the first part of the memory cell array, and
the second write line is provided for the second part of the memory cell array.

8. The device according to claim 1, wherein
the first and second plugs are placed side by side along the first direction between the first and second write lines.

9. The device according to claim 1, wherein
a longer side of the magnetoresistance effect elements extends along the first and second write lines.

10. The device according to claim 1, wherein
the magnetoresistance effect elements are placed along a plane made by the first, second, and third write lines, and have an longer side which has an angle with respect to the first, second, and third write lines.

11. A magnetic storage device comprising:
a first memory cell array and a second memory cell array having magnetoresistance effect elements placed in a matrix;
a first write line extending along a first direction in the first memory cell array, current being supplied to flow in the first write line only in the first direction;
a second write line extending along the first direction in the second memory cell array, current being supplied to flow in the second write line only in the second direction opposite to the first direction;
a third write line extending along a third direction which is orthogonal to the first direction in the first memory cell array, at least one of the magnetoresistance effect elements being placed where the first and third write lines cross;
a fourth write line extending along the third direction in the second memory cell array, at least one of the magnetoresistance effect elements being placed where the second and fourth write lines cross;
a first electrode provided between the first and third write lines;

a first plug connected to the first electrode and provided at a location apart from the first write line along the third direction;

a second electrode provided between the second and fourth write lines; and a second plug connected to the second electrode and provided at a location apart from the second write line along an opposite direction to the third direction.

12. The device according to claim 11, further comprising:

a current source supplying current to the first and second write lines, and placed between the first and second memory cell arrays.

13. The device according to claim 11, wherein the first electrode and the second electrode have a same form, and the magnetoresistance effect elements have a same form.

14. The device according to claim 13, wherein the first and second electrodes are of symmetry about the first write line.

15. The device according to claim 14, wherein a relative positional relationship of one of the magnetoresistance effect elements between the first and third write lines, the first write line and the first electrode is a same as a relative positional relationship of one of the magnetoresistance effect elements between the second and fourth write lines, the second write line and the second electrode.

16. A magnetic storage device comprising:

a memory cell array having magnetoresistance effect elements placed in a matrix;

a first write line extending along a first direction, current being supplied to flow in the first write line only in the first direction;

a second write line extending along the first direction, current being supplied to flow in the second write line only in the second direction opposite to the first direction;

a third write line extending along a third direction which is orthogonal to the first direction, the magnetoresistance effect elements being placed where the first and third write lines cross and where the second and third write lines cross;

a first electrode provided between the first and third write lines;

a first plug connected to the first electrode and provided at a location apart from the first write line along the third direction;

a second electrode provided between the second and third write lines; and a second plug connected to the second electrode and provided at a location apart from the second write line along an opposite direction to the third direction, the first and second plugs being placed side by side along the first direction between the first and second write lines.

17. The device according to claim 16, wherein the first electrode and the second electrode have a same form, and the magnetoresistance effect elements have a same form.

18. The device according to claim 17, wherein the first and second write lines are adjacent to each other along the third direction, and the first and second electrodes are of point symmetry.

19. The device according to claim 18, wherein a relative positional relationship among one of the magnetoresistance effect elements which are located between the first and third write lines, the first write line and the first electrode is a same as a relative positional relationship among one of the magnetoresistance effect elements which are located between the second and third write lines, the second write line and the second electrode.

* * * * *